US011996286B2

(12) United States Patent
Dezelah et al.

(10) Patent No.: US 11,996,286 B2
(45) Date of Patent: May 28, 2024

(54) SILICON PRECURSORS FOR SILICON NITRIDE DEPOSITION

(71) Applicant: ASM IP HOLDING B.V., Almere (NL)

(72) Inventors: Charles Dezelah, Helsinki (FI); Hideaki Fukuda, Tokyo (JP); Viljami Pore, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/457,858

(22) Filed: Dec. 6, 2021

(65) Prior Publication Data

US 2022/0181148 A1 Jun. 9, 2022

Related U.S. Application Data

(60) Provisional application No. 63/123,137, filed on Dec. 9, 2020.

(51) Int. Cl.
*C23C 16/34* (2006.01)
*C23C 16/455* (2006.01)
(Continued)

(52) U.S. Cl.
CPC ...... *H01L 21/02274* (2013.01); *C23C 16/345* (2013.01); *C23C 16/45542* (2013.01);
(Continued)

(58) Field of Classification Search
None
See application file for complete search history.

(56) References Cited

U.S. PATENT DOCUMENTS

| 4,653,428 A | 3/1987 | Wilson et al. |
| 4,668,365 A | 5/1987 | Foster et al. |

(Continued)

FOREIGN PATENT DOCUMENTS

| CN | 1705767 | 12/2005 |
| JP | 01-103844 | 4/1989 |

(Continued)

OTHER PUBLICATIONS

Aylett et al., "The Preparation and Properties of Dimethylamino- and Diethylamino-silane", J. Chem. Soc. (A), 1967, pp. 652-655.
(Continued)

*Primary Examiner* — Shamim Ahmed
*Assistant Examiner* — Bradford M Gates
(74) *Attorney, Agent, or Firm* — Banner & Witcoff, Ltd.

(57) ABSTRACT

The current disclosure relates to a vapor deposition assembly for depositing silicon nitride on a substrate by a plasma-enhanced cyclic deposition process. The disclosure also relates to a method for depositing silicon nitride on a substrate by a plasma-enhanced cyclic deposition process. The method comprises providing a substrate in a reaction chamber, providing a vapor-phase silicon precursor according to the formula $SiH_3X$, wherein X is iodine or bromine, into the reaction chamber, removing excess silicon precursor and possible reaction byproducts from the reaction chamber and providing a reactive species generated from a nitrogen-containing plasma into the reaction chamber to form silicon nitride on the substrate. The disclosure further relates to structure and devices formed by the method.

17 Claims, 2 Drawing Sheets

(51) Int. Cl.
*C23C 16/52* (2006.01)
*H01J 37/32* (2006.01)
*H01L 21/02* (2006.01)

(52) U.S. Cl.
CPC .. *C23C 16/45544* (2013.01); *C23C 16/45553* (2013.01); *C23C 16/52* (2013.01); *H01J 37/32357* (2013.01); *H01J 37/32449* (2013.01); *H01L 21/0217* (2013.01); *H01L 21/02211* (2013.01); *H01L 21/0228* (2013.01); *H01J 2237/332* (2013.01)

(56) References Cited

U.S. PATENT DOCUMENTS

| | | |
|---|---|---|
| 4,683,147 A | 7/1987 | Eguchi et al. |
| 4,683,834 A | 8/1987 | Fujimoto et al. |
| 4,696,834 A | 9/1987 | Varaprath |
| 5,024,716 A | 6/1991 | Sato |
| 5,939,333 A | 8/1999 | Hurley et al. |
| 6,391,803 B1 | 5/2002 | Kim et al. |
| 6,475,276 B1 | 11/2002 | Elers et al. |
| 6,586,056 B2 | 7/2003 | Arkles et al. |
| 6,590,251 B2 | 7/2003 | Kang et al. |
| 6,730,614 B1 | 5/2004 | Lim et al. |
| 6,756,318 B2 | 6/2004 | Nguyen et al. |
| 6,933,245 B2 | 8/2005 | Lee et al. |
| 7,144,806 B1 | 12/2006 | Fair et al. |
| 7,393,561 B2 | 7/2008 | Paranjpe |
| 7,473,655 B2 | 1/2009 | Wang et al. |
| 7,524,774 B2 | 4/2009 | Sasaki et al. |
| 7,531,679 B2 | 5/2009 | Wang et al. |
| 7,625,609 B2 | 12/2009 | Matsuura |
| 7,629,270 B2 | 12/2009 | Swerts et al. |
| 7,651,955 B2 | 1/2010 | Ranish et al. |
| 7,713,592 B2 | 5/2010 | Nguyen et al. |
| 7,713,874 B2 | 5/2010 | Milligan |
| 8,080,290 B2 | 12/2011 | Hasebe et al. |
| 8,114,761 B2 | 2/2012 | Mandrekar et al. |
| 8,119,544 B2 | 2/2012 | Hasebe et al. |
| 8,236,097 B2 | 8/2012 | Wang et al. |
| 8,242,031 B2 | 8/2012 | Mallick et al. |
| 8,273,639 B2 | 9/2012 | Ji et al. |
| 8,298,628 B2 | 10/2012 | Yang et al. |
| 8,329,599 B2 | 12/2012 | Fukazawa et al. |
| 8,361,910 B2 | 1/2013 | Mahajani |
| 8,563,096 B2 | 10/2013 | Matsunaga et al. |
| 8,580,664 B2 | 11/2013 | Clark |
| 8,592,328 B2 | 11/2013 | Hausmann et al. |
| 8,647,722 B2 | 2/2014 | Kobayashi et al. |
| 8,647,993 B1 | 2/2014 | LaVoie et al. |
| 8,722,546 B2 | 5/2014 | Fukazawa et al. |
| 8,728,956 B2 | 5/2014 | LaVoie et al. |
| 8,828,866 B1 | 9/2014 | Wei et al. |
| 8,937,353 B2 | 1/2015 | Chen et al. |
| 8,956,984 B2 | 2/2015 | Okuda |
| 9,214,333 B1 | 12/2015 | Sims et al. |
| 9,263,250 B2 | 2/2016 | Kakimoto et al. |
| 9,287,113 B2 | 3/2016 | Kang et al. |
| 9,371,338 B2 | 6/2016 | Dussarrat et al. |
| 9,390,914 B2 | 7/2016 | Wang et al. |
| 9,455,138 B1 | 9/2016 | Fukazawa et al. |
| 9,564,309 B2 | 2/2017 | Niskanen et al. |
| 9,576,792 B2 | 2/2017 | Chen et al. |
| 9,627,221 B1 | 4/2017 | Zaitsu et al. |
| 9,824,881 B2 | 11/2017 | Niskanen et al. |
| 9,960,033 B1 | 5/2018 | Nozawa |
| 9,984,869 B1 | 5/2018 | Blanquart |
| 10,269,558 B2 | 4/2019 | Blanquart et al. |
| 10,269,559 B2 | 4/2019 | Abel et al. |
| 10,381,219 B1 | 8/2019 | Ueda et al. |
| 10,410,857 B2 | 9/2019 | Suzuki et al. |
| 10,580,645 B2 | 3/2020 | Ueda et al. |
| 10,784,102 B2 | 9/2020 | Blanquart et al. |
| 10,867,788 B2 | 12/2020 | Blanquart et al. |
| 11,152,206 B2 | 10/2021 | Chandra et al. |
| 11,251,035 B2 | 2/2022 | Blanquart et al. |
| 11,286,562 B2 | 3/2022 | Niskanen |
| 2001/0012701 A1 | 8/2001 | Kang et al. |
| 2002/0016084 A1* | 2/2002 | Todd ............... H01L 21/02219 438/791 |
| 2002/0022357 A1 | 2/2002 | Iijima et al. |
| 2002/0061659 A1 | 5/2002 | Abe |
| 2002/0068466 A1 | 6/2002 | Lee et al. |
| 2002/0119327 A1 | 8/2002 | Arkles et al. |
| 2002/0151426 A1 | 10/2002 | Murata et al. |
| 2002/0180028 A1 | 12/2002 | Borovik et al. |
| 2003/0097987 A1 | 5/2003 | Fukuda |
| 2003/0118872 A1 | 6/2003 | Patel et al. |
| 2003/0215570 A1 | 11/2003 | Seutter et al. |
| 2003/0228770 A1 | 12/2003 | Lee et al. |
| 2004/0042307 A1 | 3/2004 | Ohmi et al. |
| 2004/0121085 A1 | 6/2004 | Wang et al. |
| 2004/0142557 A1 | 7/2004 | Levy et al. |
| 2004/0146644 A1 | 7/2004 | Xiao et al. |
| 2004/0146660 A1 | 7/2004 | Goodwin et al. |
| 2004/0224089 A1 | 11/2004 | Singh et al. |
| 2005/0000430 A1 | 1/2005 | Jang et al. |
| 2005/0025885 A1 | 2/2005 | McSwiney et al. |
| 2005/0145177 A1 | 7/2005 | McSwiney et al. |
| 2005/0159017 A1 | 7/2005 | Kim et al. |
| 2005/0181633 A1 | 8/2005 | Hochberg et al. |
| 2005/0183666 A1* | 8/2005 | Tsuji ............... H01J 37/32082 118/715 |
| 2005/0282350 A1 | 12/2005 | Chou et al. |
| 2006/0019032 A1 | 1/2006 | Wang et al. |
| 2006/0084283 A1 | 4/2006 | Paranjpe et al. |
| 2006/0148271 A1 | 7/2006 | Borovik et al. |
| 2006/0213437 A1 | 9/2006 | Ishizaka et al. |
| 2006/0255315 A1 | 11/2006 | Yellowaga et al. |
| 2006/0292844 A1 | 12/2006 | Olsen |
| 2007/0026540 A1 | 2/2007 | Nooten et al. |
| 2007/0082132 A1 | 4/2007 | Shinriki et al. |
| 2007/0116888 A1 | 5/2007 | Faguet |
| 2007/0202254 A1 | 8/2007 | Ganguli et al. |
| 2007/0232071 A1 | 10/2007 | Balseanu et al. |
| 2007/0251444 A1 | 11/2007 | Gros-Jean et al. |
| 2008/0020591 A1 | 1/2008 | Balseanu et al. |
| 2008/0020593 A1 | 1/2008 | Wang et al. |
| 2008/0050523 A1 | 2/2008 | Kitazoe et al. |
| 2008/0146033 A1 | 6/2008 | Park |
| 2008/0242077 A1 | 10/2008 | Clark |
| 2008/0242116 A1 | 10/2008 | Clark |
| 2008/0274605 A1 | 11/2008 | Hoshi et al. |
| 2008/0292798 A1 | 11/2008 | Huh et al. |
| 2009/0041952 A1 | 2/2009 | Yoon et al. |
| 2009/0155606 A1 | 6/2009 | Yoon et al. |
| 2009/0163041 A1 | 6/2009 | Mungekar et al. |
| 2009/0233434 A1 | 9/2009 | Kim et al. |
| 2009/0246972 A1 | 10/2009 | Kher et al. |
| 2009/0263972 A1 | 10/2009 | Balseanu et al. |
| 2009/0269941 A1 | 10/2009 | Raisanen et al. |
| 2009/0275210 A1 | 11/2009 | Shanker et al. |
| 2009/0311857 A1 | 12/2009 | Todd et al. |
| 2010/0041243 A1 | 2/2010 | Cheng et al. |
| 2010/0124621 A1 | 5/2010 | Kobayashi et al. |
| 2010/0184302 A1 | 7/2010 | Lee et al. |
| 2010/0285237 A1 | 11/2010 | Ditizio et al. |
| 2010/0304047 A1 | 12/2010 | Yang et al. |
| 2010/0304574 A1 | 12/2010 | Nodera et al. |
| 2011/0014795 A1 | 1/2011 | Lee et al. |
| 2011/0086516 A1 | 4/2011 | Lee et al. |
| 2011/0129990 A1 | 6/2011 | Mandrekar et al. |
| 2011/0136343 A1 | 6/2011 | Wang et al. |
| 2011/0136347 A1 | 6/2011 | Kovarsky et al. |
| 2011/0159703 A1 | 6/2011 | Liang et al. |
| 2011/0183528 A1 | 7/2011 | Wang et al. |
| 2011/0244690 A1 | 10/2011 | Shanker et al. |
| 2011/0256734 A1 | 10/2011 | Hausmann et al. |
| 2011/0272008 A1 | 11/2011 | Mungekar et al. |
| 2012/0009802 A1 | 1/2012 | LaVoie et al. |
| 2012/0021127 A1 | 1/2012 | Sato et al. |
| 2012/0021138 A1 | 1/2012 | Ditizio et al. |
| 2012/0028454 A1 | 2/2012 | Shankar et al. |
| 2012/0028469 A1 | 2/2012 | Onizawa et al. |

(56) References Cited

U.S. PATENT DOCUMENTS

| | | |
|---|---|---|
| 2012/0077350 A1 | 3/2012 | Miya et al. |
| 2012/0149213 A1 | 6/2012 | Nittala et al. |
| 2012/0153442 A1 | 6/2012 | Honda et al. |
| 2012/0164848 A1 | 6/2012 | Fujii et al. |
| 2012/0178264 A1 | 7/2012 | Murakami et al. |
| 2012/0196048 A1 | 8/2012 | Ueda |
| 2012/0196450 A1 | 8/2012 | Balseanu et al. |
| 2012/0213940 A1 | 8/2012 | Mallick |
| 2012/0220139 A1 | 8/2012 | Lee et al. |
| 2012/0251737 A1 | 10/2012 | Osaki et al. |
| 2012/0295449 A1 | 11/2012 | Fukazawa |
| 2013/0040447 A1 | 2/2013 | Swaminathan et al. |
| 2013/0065371 A1 | 3/2013 | Wei et al. |
| 2013/0078392 A1 | 3/2013 | Xiao et al. |
| 2013/0084714 A1 | 4/2013 | Oka et al. |
| 2013/0095664 A1 | 4/2013 | Matero et al. |
| 2013/0115374 A1 | 5/2013 | Jayakar et al. |
| 2013/0115763 A1 | 5/2013 | Takamure et al. |
| 2013/0157466 A1 | 6/2013 | Fox et al. |
| 2013/0171839 A1 | 7/2013 | Nguyen et al. |
| 2013/0175621 A1 | 7/2013 | Chen et al. |
| 2013/0183835 A1 | 7/2013 | Nguyen et al. |
| 2013/0189854 A1 | 7/2013 | Hausmann et al. |
| 2013/0224964 A1 | 8/2013 | Fukuzawa et al. |
| 2013/0244446 A1 | 9/2013 | Tsuji et al. |
| 2013/0252439 A1 | 9/2013 | Hirose et al. |
| 2013/0323435 A1 | 12/2013 | Xiao et al. |
| 2013/0330933 A1 | 12/2013 | Fukuzawa et al. |
| 2014/0023794 A1 | 1/2014 | Mahajani et al. |
| 2014/0030444 A1 | 1/2014 | Swaminathan et al. |
| 2014/0051263 A1 | 2/2014 | Tanaka et al. |
| 2014/0062304 A1 | 3/2014 | Nakano et al. |
| 2014/0073144 A1 | 3/2014 | Chatterjee et al. |
| 2014/0113457 A1 | 4/2014 | Sims et al. |
| 2014/0124841 A1 | 5/2014 | Xie et al. |
| 2014/0141625 A1 | 5/2014 | Fukazawa et al. |
| 2014/0174353 A1 | 6/2014 | Spangler et al. |
| 2014/0191301 A1 | 7/2014 | He et al. |
| 2014/0193983 A1 | 7/2014 | LaVoie |
| 2014/0227458 A1 | 8/2014 | Karakawa et al. |
| 2014/0273477 A1* | 9/2014 | Niskanen ............ H01L 21/0228 438/703 |
| 2014/0273526 A1 | 9/2014 | Thompson |
| 2014/0273527 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0287164 A1 | 9/2014 | Xiao et al. |
| 2014/0342573 A1 | 11/2014 | Hirose et al. |
| 2014/0363980 A1 | 12/2014 | Kawamata et al. |
| 2015/0004317 A1 | 1/2015 | Dussarrat et al. |
| 2015/0031218 A1 | 1/2015 | Karakawa |
| 2015/0104954 A1 | 4/2015 | Pore |
| 2015/0104955 A1 | 4/2015 | Pore |
| 2015/0125628 A1 | 5/2015 | Kim et al. |
| 2015/0162185 A1 | 6/2015 | Pore |
| 2015/0194637 A1 | 7/2015 | Ishikawa |
| 2015/0206719 A1 | 7/2015 | Swaminathan et al. |
| 2015/0255324 A1 | 9/2015 | Li et al. |
| 2015/0259791 A1 | 9/2015 | Hausmann et al. |
| 2015/0287591 A1 | 10/2015 | Pore et al. |
| 2016/0108518 A1 | 4/2016 | Park et al. |
| 2017/0051405 A1 | 2/2017 | Fukazawa et al. |
| 2017/0053792 A1 | 2/2017 | Lu et al. |
| 2017/0253964 A1 | 9/2017 | Kato et al. |
| 2017/0372886 A1 | 12/2017 | Chen et al. |
| 2018/0033625 A1 | 2/2018 | Yoo et al. |
| 2018/0151346 A1 | 5/2018 | Blanquart |
| 2018/0182613 A1 | 6/2018 | Blanquart et al. |
| 2018/0230591 A1 | 8/2018 | Jang et al. |
| 2018/0286663 A1 | 10/2018 | Kobayashi et al. |
| 2018/0350587 A1 | 12/2018 | Jia et al. |
| 2019/0057858 A1 | 2/2019 | Hausmann et al. |
| 2019/0080903 A1 | 3/2019 | Abel et al. |
| 2019/0148398 A1 | 5/2019 | Kim et al. |
| 2019/0259598 A1 | 8/2019 | Chen et al. |
| 2019/0279866 A1 | 9/2019 | Pore |
| 2019/0330736 A1 | 10/2019 | Wang et al. |
| 2019/0348271 A1* | 11/2019 | Yan ..................... C23C 16/345 |
| 2022/0005693 A1 | 1/2022 | Mizoguchi et al. |

FOREIGN PATENT DOCUMENTS

| | | |
|---|---|---|
| JP | 11-150110 | 6/1999 |
| JP | 05-070957 | 3/2003 |
| JP | 2006/190770 | 7/2006 |
| JP | 2007-005696 | 1/2007 |
| JP | 2010-103484 | 5/2010 |
| JP | 2012-138641 | 7/2012 |
| JP | 2012-216873 | 8/2012 |
| JP | 2013/125762 | 6/2013 |
| KR | 2005-0115067 | 12/2005 |
| KR | 2013-0086989 | 8/2013 |
| KR | 2014-0147086 | 12/2014 |
| KR | 101491726 | 2/2015 |
| KR | 2015-0040769 | 4/2015 |
| KR | 2015-0079470 | 7/2015 |
| WO | WO 02/098962 | 12/2002 |
| WO | WO 2011/162136 | 12/2011 |
| WO | WO 2012/144523 | 10/2012 |
| WO | WO 2013/121936 | 8/2013 |
| WO | WO 2017/070190 | 4/2017 |

OTHER PUBLICATIONS

Cho, Namtae, "Processing of Boron Carbide," Ph.D. Thesis, School of Materials Science and Engineering, Georgia Institute of Technology, 2006, in 89 pages.
Domnich, et al., "Boron Carbide: Structures, Properties, and Stability under Stress," J. Am. Ceram. Soc., vol. 94, No. 11, 2011, pp. 3605-3628.
File History of U.S. Appl. No. 15/966,717, filed Apr. 30, 2018.
File History of U.S. Appl. No. 13/830,084, filed Mar. 14, 2013.
File History of U.S. Appl. No. 15/703,241, filed Sep. 13, 2017.
File History of U.S. Appl. No. 16/574,542, filed Sep. 18, 2019.
File History of U.S. Appl. No. 14/062,328, filed Oct. 24, 2013.
File History of U.S. Appl. No. 14/167,904, filed Jan. 29, 2014.
File History of U.S. Appl. No. 15/414,485, filed Jan. 24, 2017.
File History of U.S. Appl. No. 15/902,300, filed Feb. 22, 2018.
File History of U.S. Appl. No. 16/540,349, filed Aug. 14, 2019.
File History of U.S. Appl. No. 17/101,428, filed Nov. 23, 2020.
File History of U.S. Appl. No. 14/855,261, filed Sep. 15, 2015.
File History of U.S. Appl. No. 15/426,593, filed Feb. 7, 2017.
File History of U.S. Appl. No. 15/706,435, filed Sep. 15, 2017.
File History of U.S. Appl. No. 16/381,634, filed Apr. 11, 2019.
File History of U.S. Appl. No. 16/987,961, filed Aug. 7, 2020.
File History of U.S. Appl. No. 14/834,290, filed Aug. 24, 2015.
File History of U.S. Appl. No. 16/543,917, filed Aug. 19, 2019.
Keinan et al., "Diiodosilane. 1. A Novel Reagent for Deoxygenation of Alcohols and Ethers," J. Org. Chem. (1987), 52, 4846-4851.
Keinan et al., "Diiodosilane. 2. A Multipurpose Reagent for Hydrolysis and Reductive Iodination of Ketals, Acetals, Ketones, and Aldehydes," J. Org. Chem. (1990), 55, 2927-2938.
Keinan et al., "Diiodosilane. 3. Direct Synthesis of Acyl Iodides from Carboxylic Acids, Esters, Lactones, Acyl Chlorides, and Anhydrides," J. Org. Chem. (1990), 55, 3922-3926.
Knoops, Harm C.M. et al. "Plasma-assisted ALD of Silicon Nitride from BTBAS," 131h International Conference on Atomic Layer Deposition, Jul. 28-31, 2013, San Diego, California, U.S.A., 21 pages.
Lin et al., "Silicon Nitride Films Deposited by Atmospheric Pressure Chemical Vapor Deposition", Mat. Res. Soc. Symp. Proc. vol. 495, 1998 Materials Research Society, pp. 107-112.
Lowenstein, et al., "Chemical etching of thermally oxidized silicon nitride: comparison of wet dry etching methods", Journal of the Electrochemical Society, vol. 138, No. 5, 1991, 1389-1394.
Pedersen, et al. "Low Temperature CVD of Thin, Amorphous Boron-Carbon Films for Neutron Detectors," 2012, Chemical Vapor Deposition, (18), 7-9, 221-224.

(56) References Cited

OTHER PUBLICATIONS

Sarubbi, et al., "Pure Boron-Doped Photodiodes: a Solution for Radiation Detection in EUV Lithography," ESSDERC 2008—38th European Solid-State Device Research Conference, 2008, pp. 278-281.
Tamizhmani et al., "Physical Characterization of a-Si Thin Films Deposited by Thermal Decomposition of Iodosilanes," J. Phys. D: Appl. Phys. 24 (1991), 1015-1021.
Tamizhmani et al., "Some Physical Properties of Undoped Amorphous Silicon Prepared by a New Chemical Vapor Deposition Process Using Iodosilanes", Chem. Mater. (1990), 2, 473-476.
Triyoso et al., "Robust PEALD SiN spacer for gate first high-k metal gate integration", IEEE, 2012, 4 pages.

\* cited by examiner

SILICON PRECURSORS FOR SILICON NITRIDE DEPOSITION

FIELD

The present disclosure generally relates to methods and systems suitable for semiconductor device manufacturing. More particularly, the disclosure relates to methods and systems for depositing silicon nitride and precursors for depositing silicon nitride.

BACKGROUND

In the field of semiconductor device technology, silicon nitride layers may be utilized during the manufacture of integrated circuits. For example, silicon nitride may be utilized as an insulating material during the fabrication of semiconductor device structures, such as, for example, transistors, memory cells, logic devices, memory arrays, etc.

Common silicon nitride layer deposition processes require high temperature deposition. However, state of the art device structures may not be able to withstand such a high thermal budget, which may further result in a deterioration of device performance and may cause device integration problems. An alternative solution to high temperature deposition processes may be to utilize a plasma to activate the precursors which may in turn allow for low temperature reactions and reduced deposition temperatures for silicon nitride layers. For example, plasma enhanced atomic layer deposition (PEALD) processes may be utilized to deposit high quality, conformal, silicon nitride layers.

In the current disclosure, further improvements to the PEALD processes are described.

SUMMARY OF THE INVENTION

This summary may introduce a selection of concepts in a simplified form, which may be described in further detail below. This summary is not intended to necessarily identify key features or essential features of the claimed subject matter, nor is it intended to be used to limit the scope of the claimed subject matter.

In one aspect, a deposition assembly for depositing silicon nitride on a substrate by a plasma-enhanced cyclic deposition process is disclosed. The vapor deposition assembly comprises a reaction chamber constructed and arranged to hold the substrate, a silicon precursor source constructed and arranged to provide a silicon precursor comprising $SiH_3X$, wherein X is Br or I, into the reaction chamber, a nitrogen precursor source constructed and arranged to provide nitrogen precursor gas into the reaction chamber and a temperature regulation system for regulating a temperature of the silicon precursor source. The assembly comprises a controller operably connected to the silicon precursor source and the nitrogen precursor source, and configured and programmed to control the temperature within the silicon precursor source between 15° C. and 45° C.; to provide a silicon precursor in the reaction chamber; and to provide nitrogen-containing plasma in the reaction chamber to deposit silicon nitride on the substrate.

Further, various embodiments of the present disclosure relate to methods of depositing silicon nitride on a substrate by a plasma-enhanced cyclic deposition process. The method according to the current disclosure comprises providing a substrate in a reaction chamber and providing a vapor-phase silicon precursor into the reaction chamber. The silicon precursor according to the current disclosure has a formula $SiH_3X$, wherein X is iodine or bromine. After silicon precursor is provided into the reaction chamber, excess silicon precursor and possible reaction byproducts are removed from the reaction chamber and a reactive species generated from a nitrogen-containing plasma is provided into the reaction chamber to form silicon nitride on the substrate. In the process, a temperature of the silicon precursor is regulated to be between 15° C. and 45° C.

In an additional aspect, a structure comprising silicon nitride deposited according to the current disclosure is disclosed. In another aspect, a semiconductor device comprising silicon nitride deposited according to the current disclosure is disclosed.

Silicon nitride, such as conformal silicon nitride layers have use in a number of different important applications in memory and logic devices. In DRAM these include airgap close, cell bitline spacers, patterning spacers and gapfill. For VNAND toposelective SiN is important and for PCRAM protective encapsulation layers are needed. Logic devices also need high quality SiN for patterning spacers, various SiN liners (for fin, low-k spacer, epi S/D or gate cap), etch stop layers and gapfill. There is a need in the art especially for silicon nitride layers displaying low wet etch ratios and high growth speeds and that may be deposited on three-dimensional structures.

Silicon nitride layers by ALD remain challenging. It is difficult to get high quality layers at low temperatures with the right properties to fulfill the application requirements. The methods and assemblies according to the current disclosure may allow for more efficient growth of high quality silicon nitride. It may be possible to grow silicon nitride layers faster without having to increase the deposition temperature. Conversely, a lower deposition temperature may be used while maintaining deposition speed. It may further be possible to reduce the use of hydrogen plasma in the deposition, while retaining process efficiency and quality of deposited silicon nitride.

BRIEF DESCRIPTION OF THE DRAWINGS

The accompanying drawings, which are included to provide a further understanding of the disclosure and constitute a part of this specification, illustrate exemplary embodiments, and together with the description help to explain the principles of the disclosure. In the drawings

DETAILED DESCRIPTION

The description of exemplary embodiments of methods, structures, devices and assemblies provided below is merely exemplary and is intended for purposes of illustration only. The following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

In an aspect, a method of depositing silicon nitride on a substrate by a cyclic deposition process is disclosed. The method comprises providing a substrate in a reaction chamber, providing a vapor-phase silicon precursor into the reaction chamber, removing excess silicon precursor and possible reaction byproducts from the reaction chamber and providing a reactive species generated from a nitrogen-containing plasma into the reaction chamber to form silicon nitride on the substrate. The silicon precursor according to the current disclosure comprises, consist essentially of, or consist of a compound according to the formula $SiH_3X$, wherein X is iodine or bromine. Further, methods of forming a structure and a device, as well as structures and devices formed according to the methods of the current disclosure are disclosed.

The formula of the silicon nitride is generally referred to herein as SiN for simplicity. However, the skilled artisan will understand that the actual formula of the silicon nitride, representing the Si:N ratio in the layer and excluding hydrogen or other impurities, can be represented as $SiN_x$, where x varies from about 0.5 to about 2.0, as long as some Si—N bonds are formed. In some embodiments, x may vary from about 0.9 to about 1.7, from about 1.0 to about 1.5, or from about 1.2 to about 1.4. In some embodiments silicon nitride is formed where Si has an oxidation state of +IV and the amount of nitride in the material might vary.

In the method according to the current disclosure, SiN may be deposited as a layer. The thickness of a SiN layer deposited according to the current disclosure may be from about 1 nm to about 50 nm. For example, a SiN layer according to the current disclosure may have a thickness from about 1 nm to about 20 nm, or from about 1 nm to about 10 nm or from about 1 nm to about 8 nm, or from about 1 nm to about 5 nm, or from about 1 nm to about 4 nm. In some embodiments, a SiN layer according to the current disclosure may have a thickness from about 2 nm to about 20 nm, or from about 4 nm to about 15 nm or from about 4 nm to about 8 nm. As used herein, the term "film" and/or "layer" can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, the term substrate may refer to any underlying material or materials that may be used to form, or upon which, a device, a circuit, material or a layer may be formed. A substrate may include semiconductor materials, such as, but not limited to, silicon (Si), germanium (Ge), germanium tin (GeSn), silicon germanium (SiGe), silicon germanium tin (SiGeSn), silicon carbide (SiC), or a group III-V semiconductor material. A substrate can include one or more layers overlying the semiconductor material. The substrate can include various topologies, such as gaps, including recesses, lines, trenches or spaces between elevated portions, such as fins, and the like formed within or on at least a portion of a layer of the substrate. The substrate may include dielectric materials, such as, but not limited to, silicon containing dielectric materials and metal oxide dielectric materials. In some embodiments, the substrate may comprise one or more dielectric material comprising a silicon containing dielectric material such as, but not limited to, silicon dioxide ($SiO_2$), silicon sub-oxides, silicon nitride ($Si_3N_4$), silicon oxynitride (SiON), silicon oxycarbide (SiOC), silicon oxycarbide nitride (SiOCN), silicon carbon nitride (SiCN). In some embodiments, the substrate may comprise one or more dielectric surfaces comprising a metal oxide such as, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), hafnium silicate ($HfSiO_x$), and lanthanum oxide ($La_2O_3$). Substrate may include other nitrides, for example TiN, insulating materials, dielectric materials, conductive materials, metals, such as such as tungsten, ruthenium, molybdenum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The current silicon precursors may allow depositing of high-quality SiN layers on substrates that are sensitive to hydrogen plasma. In some embodiments, substrate may comprise sensitive materials.

In some embodiments, substrate comprises chalcogenide materials used in phase change memories. In some embodiments, substrate comprises tellurides, such as $Sb_2Te_3$, GeTe, $Ge_2Sb_2Te_5$ or GST (GeSnTe in various proportions). In some embodiments, substrate comprises selenides such as GeSe, $Sb_2Se_3$ or $In_2Se_3$. In some embodiments, substrate comprises 2D materials, such as graphene, $MoS_2$ and/or other transition metal sulfides. In some embodiments, substrate comprises organic materials. In some embodiments, substrate comprises polymers, such as organic polymers. In some embodiments, substrate comprises photoresist material. In some embodiments, substrate comprises amorphous carbon.

In some embodiments, substrate comprises three-dimensional features. In some embodiments, SiN is deposited on a carbon hardmask mandrel used in multiple patterning. In some embodiments, SiN is deposited as encapsulation layer on a PCRAM memory cell.

In some embodiments, if necessary, surfaces of the substrate may be pretreated to provide reactive sites to react with the beginning phase of the deposition process. In some embodiments, a separate pretreatment step is not required. In some embodiments, the substrate is pretreated to provide a desired surface termination. In some embodiments, the substrate is pretreated with plasma.

The methods presented herein provide for deposition of SiN layers on substrate surfaces. SiN according to the current disclosure may be deposited conformally on structures on a substrate. It may be possible to deposit SiN according to the current disclosure on high aspect ratio structures. In some embodiments, SiN may be deposited conformally to a feature having a width to depth aspect ratio between 1:0.5 to 1:20. Without limiting the current disclosure to any specific theory, the silicon precursors according to the current disclosure may have properties that allow them to efficiently ingress to narrow high-aspect ratio features. Thus, the width of a feature in to which SiN according to the current disclosure is deposited may be, for example from about 4 nm to about 100 nm, such as from about 4 nm to about 50 nm, or from about 4 nm to about 20 nm, or from about 4 nm to about 10 nm, or from about 4 nm to about 8 nm. Since the current disclosure may offer an improved deposition capability in narrow gaps, gapfill conformality is improved, which may result in reduced void or seam formation if such is formed.

The method of depositing silicon nitride according to the current disclosure comprises providing a substrate in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously.

As used herein, the term "cyclic deposition" may refer to the sequential introduction of a silicon precursor and a reactive species (reactants) into a reaction chamber to deposit SiN on a substrate, and includes processing techniques such as atomic layer deposition (ALD) and cyclic chemical vapor deposition (CVD). The cyclic process for depositing SiN may be an ALD process. The cyclic process for depositing SiN may be a CVD process. The cyclic process for depositing SiN may be hybrid process. The provision and removal of a reactant from the reaction chamber may be considered a phase. In a first phase, a silicon precursor is provided into the reaction chamber and may adsorb, through, for example, chemisorption, on the substrate. In a second phase, a reactive species is provided into the reaction chamber and it may convert silicon on the substrate to silicon nitride. Additional phases may be added to adjust the composition of the SiN layer. In some embodiments, two of the phases may overlap, or be combined. For example, the silicon precursor and the reactive species may be provided simultaneously in pulses that partially or completely overlap. In addition, although referred to as the first and second phases, and the first and second reactants, the order of the phases may be varied, and deposition cycle may begin with any one of the phases. That is, unless specified otherwise, the reactants can be provided in any order, and the process may begin with any of the reactants. Thus, in some embodiments, one or more deposition cycles begin with provision of the silicon precursor, followed by the reactive species. In other embodiments deposition may begin with provision of the reactive species, followed by the silicon precursor.

The ALD process may be a plasma-enhanced ALD (PEALD) process. ALD-type processes are based on controlled, typically self-limiting surface reactions of the precursor chemicals. Gas phase reactions are avoided by feeding a precursor and a reactive species alternately and sequentially into the reaction chamber. Vapor phase reactants are separated from each other in the reaction chamber, for example, by removing excess precursors and/or reactant by-products from the reaction chamber between reactant pulses. This may be accomplished with an evacuation step and/or with an inert gas pulse. In some embodiments, the substrate is contacted with a purge gas, such as an inert gas. For example, the substrate may be contacted with a purge gas between a silicon precursor and reactant species pulses to remove excess silicon precursor and reaction by-products.

The term "pulse" may be understood to comprise feeding reactant into the reaction chamber for a predetermined amount of time. The term "pulse" does not restrict the length or duration of the pulse and a pulse can be any length of time.

In some embodiments, each reaction is self-limiting and monolayer by monolayer growth may be substantially achieved. These may be referred to as "true ALD" reactions. In some such embodiments the silicon precursor may adsorb on the substrate surface in a self-limiting manner. A reactive species will react in turn with the adsorbed silicon precursor to form up to a monolayer of silicon nitride on the substrate. The term atomic layer deposition, as used herein, is also meant to include processes designated by related terms such as "chemical vapor atomic layer deposition", "atomic layer epitaxy" (ALE), "molecular beam epitaxy" (MBE), gas source MBE, or organometallic MBE, and chemical beam epitaxy when performed with alternating pulses of precursor composition(s).

During each cycle, the silicon precursor may be adsorbed to a deposition surface (e.g. a substrate surface or a previously deposited underlying surface, such as material from a previous deposition cycle), forming a monolayer or sub-monolayer that does not readily react with any additional precursor (i.e., a self-limiting reaction). Thereafter, if necessary, a reactive species may subsequently be introduced into the reaction chamber for use in converting the adsorbed silicon precursor to the SiN on the deposition surface. Further, purging steps may also be utilized during each cycle to remove excess precursor from the reaction chamber and/or remove excess reactant and/or reaction byproducts from the reaction chamber after conversion of the adsorbed precursor.

The method may also be used in a spatial atomic layer deposition assembly. In spatial ALD, the precursor and reactive species may be supplied continuously in different physical sections and the substrate is moving between the sections. There may be provided at least two sections where, in the presence of a substrate, a half-reaction can take place. If the substrate is present in such a half-reaction section a silicon precursor may be adsorbed on the substrate surface. Then, the substrate is moved to the second half-reaction zone, where the deposition cycle is completed with the reactant to form silicon nitride on the substrate. Alternatively, the substrate position could be fixed and the gas supplies could be moved, or some combination of the two. To obtain a desired layer thickness and coverage, this sequence may be repeated.

Accordingly to an embodiment, in a spatial ALD assembly the method may comprise placing the substrate in a reaction chamber comprising a two or more sections, each section separated from adjacent sections by a gas curtain, and supplying silicon precursor to the substrate in a first section of the reaction chamber. Thereafter the substrate surface is moved (e.g., laterally) with respect to the reaction chamber through a gas curtain to a second section of the reaction chamber; and reactive species is supplied to the substrate in the second section of the reaction chamber to form silicon nitride on the substrate surface. The substrate surface may be moved (e.g., laterally) with respect to the reaction chamber through a gas curtain, and supplying the silicon precursor and the reactive species including, (e.g., lateral) movement of the substrate surface with respect to the reaction chamber may be repeated to form a silicon nitride layer.

In some embodiments, a deposition process for SiN may have one or more phases which are not self-limiting. For example, in some embodiments, at least one precursor may be at least partially decomposed on the substrate surface. Thus, in some embodiments the process may operate in a process condition regime close to CVD conditions or in some cases fully in CVD conditions.

CVD type processes may involve gas phase reactions between two or more reactants. The reactants can be provided simultaneously to the reaction chamber or substrate, or in partially or completely separated pulses. The substrate and/or reaction chamber can be heated to promote the reaction between the gaseous reactants. In some embodiments the reactants are provided until a layer having a desired thickness is deposited. In some embodiments cyclic CVD type processes can be used with multiple cycles to deposit a layer having a desired thickness. In cyclic CVD-type processes, the reactants may be provided to the reaction chamber in pulses that do not overlap, or that partially or completely overlap.

In some embodiments, the method according to the current disclosure is a plasma-enhanced deposition method, for example PEALD or PECVD.

In the method according to the current disclosure, a substrate is provided in a reaction chamber, and a vapor-phase silicon precursor is provided into the reaction chamber. Accordingly, silicon precursor may be in vapor phase when it is in a reaction chamber. The silicon precursor may be partially gaseous or liquid, or even solid at some points in time prior to being provided in the reaction chamber. In other words, a silicon precursor may be solid, liquid or gaseous, for example, in a precursor vessel or other receptacle before delivery in a reaction chamber. In some embodiments, the silicon precursor is a liquefied gas before delivery in a reaction chamber.

A silicon precursor according to the current disclosure may be a liquefied gas in room temperature. The silicon precursor may be delivered from a precursor source, such a pressurized precursor vessel, tank, canister or a cylinder. In some embodiments, the silicon precursor is maintained at a pressure from about 2 bar to about 10 bar, such as from about 4 bar to about 8 bar, for example at about 5 bar or about 6 bar. In some embodiments, the silicon precursor is delivered through direct vapor delivery. In some embodiments, the precursor is diluted with a carrier gas. Providing a silicon precursor as a liquefied gas may allow higher precursor delivery rates than can be achieved with, for example, liquid precursors. This may offer advantages in applications where high growth rates are sought after. In some embodiments, silicon precursor flow is regulated by a mass flow controller. In some embodiments, silicon precursor is not heated. In some embodiments, the temperature of the silicon precursor is regulated to hold the silicon precursor in a suitable temperature. A suitable temperature for the precursor may be, for example, between about 5° C. and about 55° C., or between about 10° C. and about 45° C., or between about 15° C. and about 40° C., or between about 10° C. and about 35° C., or between about 15° C. and 35° C. In some embodiments, the precursor vessel is heated. In some embodiments, the precursor is heated by a heater.

In this disclosure, "gas" can include material that is a gas at normal temperature and pressure (NTP), a vaporized solid and/or a vaporized liquid, and can be constituted by a single gas or a mixture of gases, depending on the context. Silicon precursor may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, particularly when plasma is not introduced into a reaction chamber, molecular nitrogen and/or hydrogen can be an inert gas. A gas other than a process gas, i.e., a gas introduced without passing through a precursor injector system of a deposition assembly, other gas distribution device, or the like, can be used for, e.g., sealing the reaction chamber, and can include a seal gas. A carrier gas can be used to regulate the flow of precursor(s) and/or precursors. Thus, the precursor concentration and residence time in the reaction chamber can be adjusted. Such a gas may be called a carrier gas. In some embodiments, the method comprises supplying carrier gas in the reaction chamber.

The silicon precursor according to the current disclosure comprises, consist essentially of, or consist of a compound according to the formula $SiH_3X$, wherein X is iodine or bromine. Thus, silicon precursor according to the current disclosure comprises, consist essentially of, or consist of $SiH_3I$ or $SiH_3Br$. In some embodiments, the silicon precursor is $SiH_3I$. In some embodiments, the silicon precursor is $SiH_3Br$. Silicon precursors comprising only one halogen, specifically one iodine atom or one bromine atom, may have advantages over other types of precursors, enabling an improved silicon deposition process. Compared to alternative silicon precursors, $SiH_3I$ and $SiH_3Br$ may have higher vapor pressure, allowing easier delivery into the reaction chamber and use of lower temperatures. The silicon precursors according to the current disclosure are small and they may contain an improved halogen-to-hydrogen ratio that might positively affect achievable layer density and purity. The silicon precursors according to the current disclosure may have higher reactivity, rapid nucleation and/or improved nucleation on substrate, allowing faster layer growth and/or reduced substrate exposure time to the precursor.

In some embodiments, silicon precursor, reactive species or both are provided into the reaction chamber in pulses. In some embodiments a silicon precursor pulse (i.e. duration of providing silicon precursor into the reaction chamber) is from about 0.01 to about 0.05 seconds, or from about 0.05 seconds to about 5.0 seconds, about 0.1 seconds to about 3 seconds or about 0.2 seconds to about 1.0 second. In batch process the silicon precursor pulses can be substantially longer can be determined by the skilled artisan given the particular circumstances.

After sufficient time for a molecular layer to adsorb on the substrate surface, excess silicon reactant is removed from the reaction chamber. In some embodiments the excess first reactant is purged by stopping the flow of the first chemistry while continuing to flow a carrier gas or purge gas for a sufficient time to diffuse or purge excess reactants and reactant by-products, if any, from the reaction chamber. In some embodiments the excess first precursor is purged with the aid of inert gas, such as nitrogen or argon, that is flowing throughout the ALD cycle.

In a method according to the current disclosure, excess silicon precursor and possible reaction byproducts are removed from the reaction chamber. This may be called purging. Purging means that vapor phase precursors and/or vapor phase byproducts are removed from the substrate surface such as by evacuating the reaction chamber with a vacuum pump and/or by replacing the gas inside a reaction chamber with an inert gas such as argon or nitrogen. For example, purging may refer to a procedure in which an inert or substantially inert gas is provided to a reactor chamber in between two pulses of gases which react with each other. However, purging may be effected between two pulses of gases that do not react with each other. For example, a purge, or purging, for example by using nitrogen gas, may be provided between pulses of two precursors or between a precursor and a reducing agent. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

Purging times range from about 0.05 to 20 seconds, and can be about 0.2 and 10, or between about 0.5 and 5 seconds. In some embodiments, the silicon precursor is purged for about 0.1 seconds to about 10 seconds, about 0.3 seconds to about 5 seconds or about 0.3 seconds to about 1 second. However, other purge times can be utilized if necessary, such as where highly conformal step coverage over extremely high aspect ratio structures or other structures with complex surface morphology is needed, or where different reactor types, such as a batch reactor, are used.

After purging, a reactive species generated from a nitrogen-containing plasma is provided into the reaction chamber to form silicon nitride on the substrate. The reactive species may react with the silicon on the substrate to form silicon nitride.

Reactive species according to the current disclosure are generated from a nitrogen-containing gas. The nitrogen-containing gas thus comprises a nitrogen precursor. In some embodiments, the reactive species comprises nitrogen radicals, nitrogen atoms and/or nitrogen plasma. The reactive species may comprise other species that are not nitrogen-derived. In some embodiments, the reactive species may comprise a plasma of hydrogen, radicals of hydrogen, or atomic hydrogen in one form or another. In some embodiments, the reactive species may comprise a species from a noble gas, such as He, Ne, Ar, Kr, or Xe, or Ar or He, for example as radicals, in plasma form, or in elemental form. These reactive species from noble gases do not necessarily contribute material to the deposited layer, but can in some circumstances contribute to layer growth as well as help in the formation and ignition of plasma. In some embodiments a gas that is used to form a plasma may flow constantly throughout the deposition process but only be activated intermittently. In some embodiments, the reactive species comprises an excited species.

In some embodiments, a gas is provided to the reaction chamber continuously during each deposition cycle, or during the entire deposition process, and reactive species are provided by generating a plasma from the gas, either in the reaction chamber or upstream of the reaction chamber. In some embodiments, the gas comprises nitrogen. In some embodiments, the gas is nitrogen. In other embodiments the gas may comprise helium, or argon. The flowing gas may also serve as a purge gas for either or both reactants (or reactive species). For example, flowing nitrogen may serve as a purge gas for a silicon precursor and also serve as a source of the reactive species. In some embodiments, nitrogen, argon, or helium may serve as a purge gas for a first precursor and a source of reactive species for converting the silicon precursor to the silicon nitride layer.

In some embodiments, nitrogen-containing gas is flowed continuously to the reaction chamber during each deposition cycle. Nitrogen-containing plasma may be formed by generating a plasma in nitrogen in the reaction chamber or upstream of the reaction chamber, for example by flowing the nitrogen through a remote plasma generator.

In some embodiments, nitrogen-containing plasma is generated by flowing $H_2$ and $N_2$ gases. In some embodiments the $H_2$ and $N_2$ are provided to the reaction chamber before plasma is ignited or nitrogen and hydrogen atoms or radicals are formed. In some embodiments $H_2$ and $N_2$ are provided to the reaction chamber continuously and nitrogen-containing plasma, atoms or radicals is created or supplied when needed. In some embodiments, hydrogen gas is not used to generate plasma. Without limiting the current disclosure to any specific theory, the silicon precursors according to the current disclosure may allow the deposition of high-quality SiN films in the absence of molecular hydrogen.

Suitable plasma compositions for the method according to the current disclosure include nitrogen plasma, radicals of nitrogen, or atomic nitrogen in one form or another. In some embodiments, hydrogen plasma, radicals of hydrogen, or atomic hydrogen in one form or another are also provided. And in some embodiments, a plasma may also contain noble gases, such as He, Ne, Ar, Kr and Xe, preferably Ar or He, in plasma form, as radicals, or in atomic form.

Thus, in some embodiments the reactive species may be generated from plasma formed from compounds having both N and H, such as $NH_3$ and $N_2H_4$, a mixture of $N_2/H_2$ or other precursors having an N—H bond. In some embodiments, reactive species may be formed predominantly from $N_2$. In some embodiments, reactive species may be formed, at least in part, from $N_2$ and $H_2$. In some embodiments, the reactive species may be formed, predominantly, substantially completely or completely from $N_2$ and $H_2$. In such embodiments, $N_2$ and $H_2$ are provided at a flow ratio ($N_2/H_2$) from about 1000:1 to 20:1, or from about 20:1 to about 1:20, or from about 10:1 to about 1:10, or from about 5:1 to about 1:5, or from about 1:2 to about 4:1, and in some cases about 1:1. In some embodiments, $N_2$ and $H_2$ are provided at a flow ratio ($N_2/H_2$) from about 1000:1 to about 100:1, or from 500:1 to about 50:1, or from about 100:1 to about 20:1. For example, $N_2$ and $H_2$ may be provided at a flow ratio ($N_2/H_2$) of about 800:1, about 400:1, about 200:1, about 150:1 or about 100:1. In some embodiments, the reactive species may be formed, predominantly, substantially completely or completely from $N_2$. In some embodiments, the reactive species may be formed, predominantly, substantially completely or completely from $N_2$ and noble gases. Without limiting the current disclosure to any specific theory, silicon precursors according to the current disclosure may reduce the need for providing hydrogen in plasma for sufficient layer conformality. The presence of hydrogen-derived plasma in the deposition process may reduce step coverage of the process. Thus, the ability to reduce presence of hydrogen in the process may increase step coverage. The lower hydrogen content may have advantages especially in high aspect ratio structures, for example having an aspect ratio of 8 or above.

Flow rate of a process gas, such as a gas comprising a silicon precursor or a nitrogen-containing gas used for generating reactive species, or an inert gas, may be from about 1 slm to about 10 slm, for example from about 2 slm to about 6 slm, or from about 3 slm to about 10 slm. However, in some embodiments, a process gas flow rate may be from about 100 sccm to about 1000 sccm, for example from about 100 sccm to about 800 sccm, or from about 100 sccm to about 500 sccm, or from about 100 sccm to about 300 sccm. The lower range of process gas flow may be especially applicable to the silicon precursor gas flow.

The reactive species generated from nitrogen-containing plasma, are provided for about 0.01 seconds to about 5 seconds, such as for 0.05 seconds to 0.1 seconds, or for about 0.05 seconds to about 2 seconds. In some embodiments, reactive species are provided for about 0.1 seconds to about 10 seconds. In some embodiments the nitrogen-containing plasma, is provided for about 0.1 seconds to about 10 seconds, 0.5 seconds to about 5 seconds or 0.5 seconds to about 2.0 seconds. However, depending on the reactor type, substrate type and its surface area, nitrogen-containing plasma pulsing time may be even higher than about 10 seconds. In some embodiments, pulsing times can be on the order of minutes.

In some embodiments, nitrogen-containing plasma is provided in two or more distinct pulses, without introducing silicon precursor in between any of the two or more pulses. In some embodiments, two or more sequential plasma pulses are generated during provision of nitrogen-containing plasma by providing a plasma discharge for a first period of time, extinguishing the plasma discharge for a second period of time, for example for about 0.05 seconds to about 5 seconds, such as for 0.05 seconds to 0.1 seconds, or from about 0.1 seconds to about 10 seconds, from about 0.5 seconds to 5 seconds or about 1.0 seconds to about 4.0 seconds, and exciting it again for a third period of time before introduction of silicon precursor or a purge step. Additional pulses of plasma can be introduced in the same way. In some embodiments a plasma is ignited for the same length of time in each of the pulses.

In some embodiments, nitrogen-containing plasma may be generated by applying RF power of from about 10 W to about 2000 W, or from about 50 W to about 1000 W, or from about 100 W to about 500 W. In some embodiments the RF power density may be from about 0.02 W/cm$^2$ to about 2.0 W/cm$^2$, or from about 0.05 W/cm$^2$ to about 1.5 W/cm$^2$. The RF power may be applied to nitrogen-containing gas that flows during the nitrogen plasma pulse time, that flows continuously through the reaction chamber, and/or that flows through a remote plasma generator. Thus in some embodiments, the second reactant may be formed remotely via plasma discharge ("remote plasma") away from the substrate or reaction space. In some embodiments, the second reactant may be formed in the vicinity of the substrate or directly above substrate ("direct plasma").

In some embodiments, two or more plasma frequencies are used.

After reactive species are provide for a long enough period of time to obtain the desired SiN deposition, excess reactant and reaction byproducts may be removed from the reaction chamber. The reactive species pulse time may be sufficient to completely saturate and react the previously adsorbed molecular layer with nitrogen. As with the removal of the silicon precursor, this step may comprise stopping the generation of reactive species and continuing to flow the inert gas, such as nitrogen or argon for a time period sufficient for excess reactive species and volatile reaction by-products to diffuse out of and be purged from the reaction chamber. In other embodiments a separate purge gas may be used. The purge may, in some embodiments, be from about 0.1 seconds to about 10 seconds, about 0.1 seconds to about 4 seconds or about 0.1 seconds to about 0.5 seconds. Together, the nitrogen plasma provision and removal represent a second, reactive species phase in a silicon nitride atomic layer deposition cycle.

The two phases together represent one deposition cycle, which is repeated to form silicon nitride layers of a desired thickness. The deposited SiN can form layers, and their thickness may be adjusted by varying the number of deposition cycles. While the deposition cycle is generally referred to herein as beginning with the silicon precursor phase, it is contemplated that in other embodiments, the cycle may begin with the reactive species phase. The silicon precursor phase generally reacts with the termination left by the reactive species (i.e. nitrogen deposition) phase in the previous cycle. Thus, while no reactant may be previously adsorbed on the substrate or present in the reaction chamber if the reactive species phase is the first phase in the first deposition cycle, in subsequent cycles the reactive species phase will effectively follow the silicon precursor phase. In some embodiments one or more different deposition cycles are provided in the deposition process.

According to some embodiments of the present disclosure, deposition may be performed at temperatures ranging from about 25° C. to about 700° C., or from about 50° C. to about 600° C., or from about 100° C. to about 450° C., or from about 200° C. to about 400° C. In some embodiments, the optimum reactor temperature may be limited by the maximum allowed thermal budget. Therefore, in some embodiments the reaction temperature is from about 300° C. to about 400° C. In some applications, the maximum temperature is around about 400° C., and, therefore the PEALD process is run at that reaction temperature.

In some embodiments relating to spacer deposition on carbon material, for example, deposition may be performed at a temperature from about 75° C. to about 150° C. In some embodiments, deposition may be performed at a temperature from about 150° C. to about 300° C. Such temperatures may have advantages for substrates comprising chalcogenide material. In some embodiments, deposition may be performed at a temperature from about 300° C. to about 550° C. For example processes relating to DRAM cell bitline spacers could be performed at a temperature up to 550° C. Some embodiments might relate especially to processes in which both high growth rate and high layer quality are needed, and in which temperature requirements are becoming more stringent. The use of temperatures of 400° C. or below might be needed. Such applications relate to, for example, front-end-of-line or mid-end-of-line or gapfill processes.

According to some embodiments of the present disclosure, a pressure in the reaction chamber during processing is maintained at from about 0.01 Torr to about 50 Torr, or from about 0.1 Torr to about 10 Torr. In some embodiments, a pressure in the reaction chamber during processing is maintained from about 10 Torr to about 25 Torr, or from about 10 Torr to about 20 Torr, such as at about 15 Torr or at about 20 Torr. In certain processes, a pressure in the reaction chamber during processing is maintained from about 1 Torr to about 5 Torr, or from about 2 Torr to about 5 Torr, such as at about 3 Torr or at about 4 Torr.

The growth rate of a SiN layer, measured as growth per cycle (GPC), may be improved when silicon precursors according to the current disclosure are used. The grow rates may vary from about 0.15 Å/cycle to about 2.5 Å/cycle, depending on the process specifics. In some embodiments, GPC may be from about 0.2 Å/cycle to about 2 Å/cycle, from about 0.3 Å/cycle to about 2 Å/cycle, or from about 0.2 Å/cycle to about 1.5 Å/cycle, or from about 0.5 Å/cycle to about 2 Å/cycle.

Silicon nitride layers deposited according to the current disclosure, irrespective of whether the silicon precursor contained bromine or iodine, may achieve impurity levels or concentrations below about 3 at-%, or below about 1 at-%, or below about 0.5 at-%, or below about 0.1 at-%, or below 0.05 at-%. In some layers, the total impurity level excluding hydrogen may be below about 5 at-%, or below about 2 at-%, or below about 1 at-%, or below about 0.2 at-%, or below 0.1 at-%. In some layers, hydrogen levels may be below about 30 at-%, or below about 20 at-%, or below about 15 at-%, or below about 10 at-%, or below about 5 at-%. In some embodiments, SiN layers deposited according to the current disclosure do not comprise an appreciable amount of carbon.

According to some embodiments, the silicon nitride layers may exhibit step coverage and pattern loading effects of greater than about 65%, or greater than about 80%, or greater than about 90%, or greater than about 95%. In some cases, step coverage and pattern loading effects can be greater than about 98% and in some cases about 100% (within the accuracy of the measurement tool or method). These values can be achieved in aspect ratios of more than 2, or in aspect ratios more than 3, or in aspect ratios more than 5, or in aspect ratios more than 8. In certain embodiments, said values may be achieved for features with aspect ratios more than 10 or for features with aspect ratios more than 15 or 20.

As used herein, "pattern loading effect" is used in accordance with its ordinary meaning in this field. While pattern loading effects may be seen with respect to impurity content, density, electrical properties and etch rate. Unless indicated otherwise, the term pattern loading effect refers to the variation in layer thickness in an area of the substrate where structures are present. Thus, the pattern loading effect can be given as the layer thickness in the sidewall or bottom of a feature inside a three-dimensional structure relative to the layer thickness on the sidewall or bottom of the three-dimensional structure/feature facing the open field. As used herein, a 100% pattern loading effect (or a ratio of 1) would represent about a completely uniform layer property throughout the substrate regardless of features i.e. in other words there is no pattern loading effect (variance in a particular layer property, such as thickness, in features vs. open field).

In some embodiments, silicon nitride layers are deposited to a thickness of from about 2 nm to about 100 nm, or from about 5 nm to about 30 nm, or from about 5 nm to about 20 nm. These thicknesses can be achieved in feature sizes (width) below about 100 nm, or about 50 nm, or below about 30 nm, or below about 20 nm, and in some cases below about 15 nm. In some embodiments, the feature width may be below about 10 nm, or below about 8 nm, or below about 6 nm.

According to some embodiments silicon nitride layers with various wet etch rates (WER) may be deposited. When using a blanket WER in 0.5% dHF (nm/min), silicon nitride layers may have WER values of less than about 5, or less than about 4, or less than about 2, or less than about 1. In some embodiments it could less than about 0.3.

The blanket WER in 0.5% dHF (nm/min) relative to the WER of thermal oxide may be less than about 3, or less than about 2, or less than about 1, or less than about 0.5, or less than about 0.25, or less than about 0.1 or less than about 0.05, or less than about 0.01.

In some embodiments, the sidewall WER of the three dimensional feature, such as fin or trench relative to the top region WER of a three dimensional feature, such as fin or trench, may be less than about 4, or less than about 3, or less than about 2, or less than about 1. In some embodiments, the sidewall WER may be less than about 1.

Many applications may require, or benefit from, even layer thickness along a sidewall of a feature. Due to the properties of the silicon precursors according to the current disclosure, the thickness uniformity of a SiN layer along a sidewall of a feature may be improved compared to prior art. Especially in gaps or trenches having a width below 50 nm, or below 30 nm, or below 20 nm, layer thickness uniformity may be improved.

In some embodiments, the amount of etching of silicon nitride layers according to the present disclosure may be about two to four, such as three to four times less than amount of etching observed for thermal $SiO_2$ (TOX) in a 0.5% HF-dip process (for example, in a process in which about 2 to about 3 nm TOX is removed, one or two to four times less SiN is removed when deposited according to the methods disclosed herein).

Additionally, the precursors according to the current disclosures may allow the deposition of SiN layers with reduced stress compared to prior art processes. The reduced layer stress may be achieved while at the same time maintaining other good layer properties, such as WER, sidewall WER and step coverage. SiN layers deposited according to the current methods may have stress values from about +800 MPa to about −800 MPa, or from about +600 MPa to about −600 MPa, from about +400 MPa to about −400 MPa, from about +200 MPa to about −200 MPa, or from about +100 MPa to about −100 MPa. Positive sign indicates a layer with tensile stress and negative sign indicates a layer with compressive stress. In some embodiments, the SiN layer may be essentially stress free. In other words, layer stress may be about zero.

In another aspect, a deposition assembly for depositing silicon nitride on a substrate by a plasma-enhanced cyclic deposition process is disclosed. The deposition assembly comprises a reaction chamber constructed and arranged to hold the substrate; a silicon precursor source for a silicon precursor in gas communication via a first valve with the reaction chamber; a nitrogen precursor source for a nitrogen precursor in gas communication via a second valve with the reaction chamber for supplying nitrogen-containing plasma; and a controller operably connected to the first and second valves and configured and programmed to control: supplying a silicon precursor in the reaction chamber; and supplying nitrogen-containing plasma in the reaction chamber to deposit silicon nitride on the substrate. The assembly may further comprise a silicon precursor vessel constructed and arranged to contain and release a silicon precursor comprising $SiH_3X$, wherein X is iodine or bromine, and the assembly is constructed and arranged to provide the silicon precursor via the precursor injector system to the reaction chamber. The precursor vessel according to the current disclosure may be vessel for liquefied gas.

DETAILED DESCRIPTION OF THE DRAWINGS

Figure 1:
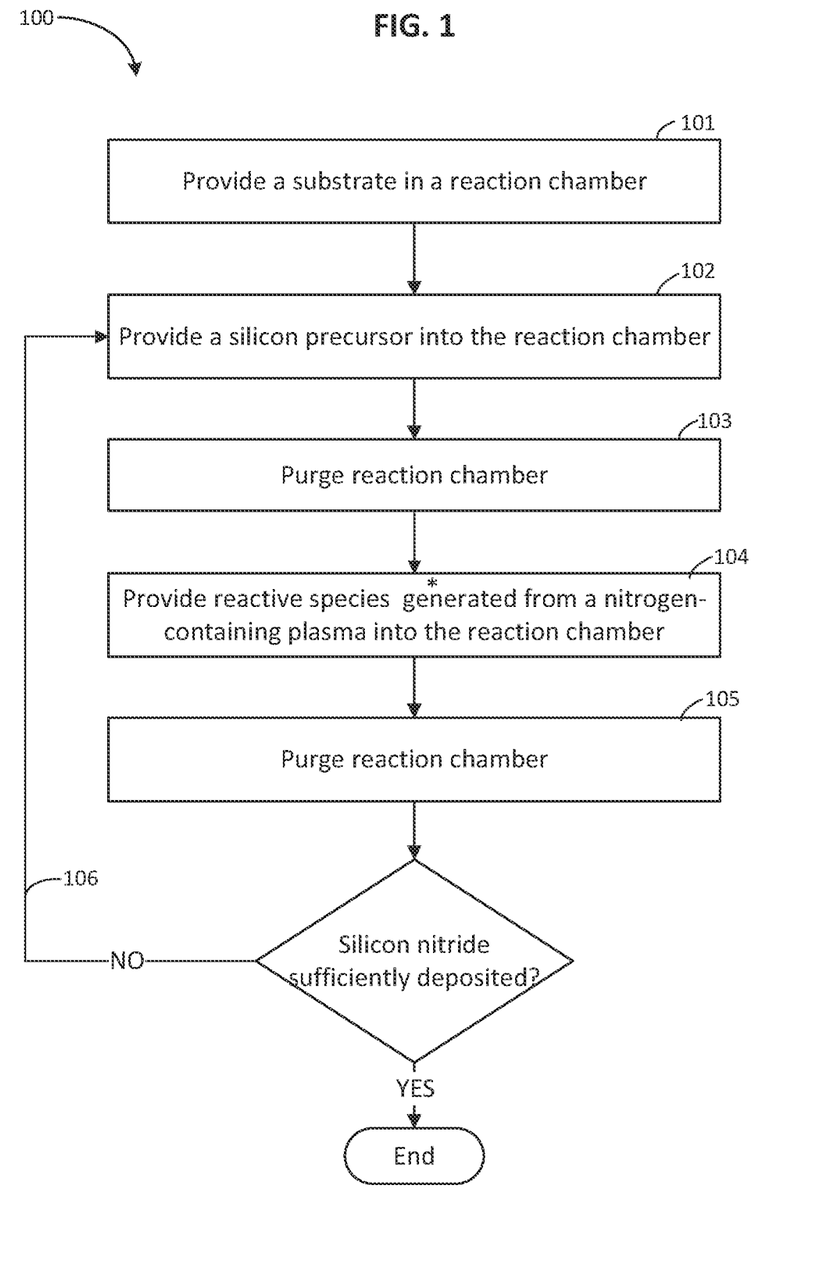
FIG. 1 illustrates an exemplary embodiment of a method according to the current disclosure.

FIG. 1 illustrates an exemplary method 100 in accordance with embodiments of the disclosure. Method 100 may be used to deposit silicon nitride on a substrate. A silicon nitride layer may be deposited. The silicon nitride layer can be used during a formation of a structure or a device, such as a structure or a device described herein. However, unless otherwise noted, methods are not limited to such applications.

At step 101, a substrate is provided into a reaction chamber of a reactor. The reaction chamber can form part of an atomic layer deposition (ALD) reactor. The reactor may be a single wafer reactor. Alternatively, the reactor may be a batch reactor. Various phases of method 100 can be performed within a single reaction chamber or they can be performed in multiple reactor chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, a reactor including the reaction chamber can be provided with a heater to activate the reactions by elevating the temperature of one or more of the substrate and/or the reactants and/or precursors.

During step 101, the substrate can be brought to a desired temperature and pressure for providing silicon precursor in the reaction chamber and/or for providing nitrogen-containing plasma into the reaction chamber. A temperature (e.g. of a substrate or a substrate support) within a reaction chamber can be, for example, from about 50° C. to about 550° C., such as 150° C., 200° C. or 300° C.

A pressure within the reaction chamber can be less than about 50 Torr or less than about 20 Torr, less than about 5 Torr, less than about 1 Torr, for example. In some embodiments, a pressure within a reaction chamber may be about 2 Torr, or about 3 Torr, or about 5 Torr or about 10 Torr, or about 15 Torr, or about 20 Torr.

Silicon precursor is provided in the reaction chamber containing the substrate at step 102. Without limiting the current disclosure to any specific theory, silicon precursor may chemisorb on the substrate during providing silicon precursor in the reaction chamber. The duration of providing silicon precursor in the reaction chamber (silicon precursor pulse time) may be, for example, about 0.01 seconds, about 0.05 seconds, about 0.1 seconds about 0.2 seconds, about 1 seconds, about 1.5 seconds, about 2 seconds, or about 3 seconds. In some embodiments, the duration of providing silicon precursor in the reaction chamber (silicon precursor pulse time) is may be less than about 0.2 seconds or less than about 0.1 seconds or less than about 1 s.

At step 103, reaction chamber may be purged by providing a gas, such as an inert gas, into the reaction chamber. Alternatively or in addition, reaction chamber may be purged by an evacuation step. Purging the reaction chamber 103, 105 may prevent or mitigate gas-phase reactions between a silicon precursor and a reducing agent, and enable self-saturating surface reactions. Surplus chemicals and reaction byproducts, if any, may be removed from the substrate surface, such as by purging the reaction chamber or by moving the substrate, before the substrate is contacted with the next reactive chemical. In some embodiments, however, the substrate may be moved to separately contact a silicon precursor and a reactive species. Because in some embodiments, the reactions may self-saturate, strict temperature control of the substrates and precise dosage control of the precursors may not be required.

When nitrogen-containing plasma is provided into the reaction chamber at step 104, reactive species formed from it may react with the adsorbed silicon precursor, or its derivate species, to form SiN. The duration of providing reactive species into the reaction chamber (reactive species pulse time) may be, for example, about 0.01 s, about 0.1 s, about 0.5 s, about 1 s, about 2 s, about 3 s, about 4 s. In some embodiments, the duration of providing reducing agent in the reaction chamber is be less than about 15 s or less than about 10 s or about 3 s. After providing reactive species into the reaction chamber, the reaction chamber may optionally be purged again (step 105) as described herein.

Steps 102, 103, 104 and optional 105, may form a deposition cycle, resulting in the deposition of SiN. The amount of deposition of SiN may be regulated through repeating (loop 106) the deposition cycle until the desired amount of SiN, or a desired thickness of a SiN layer, has been achieved. The number of repetitions depends on the rate of deposition and the targeted SiN thickness. The deposition cycle may be performed from about 20 to about 2,000 times. In some embodiments, the deposition cycle may be performed from about 20 to about 1,000 times. In some embodiments, the deposition cycle may be performed from about 20 to about 500 times, or from about 20 to about 200 times. Especially in embodiments where SiN growth rate is low or thick SiN layer is targeted, the deposition cycle may be performed from about 1,000 to about 2,000 times, such as from about 1,200 times to about 1,600 times. In some embodiments, about 150, 200, 250, 300, 400, 500, 600, 700, 800, 900, 1,200 or 1,500 deposition cycles may be performed.

When performing the method 100, SiN is deposited onto the substrate. The deposition process may be a cyclic plasma-enhanced deposition process, and may include PECVD, PEALD, or a hybrid cyclic CVD/ALD process. In some embodiments, a cyclic CVD process may comprise the introduction of two or more precursors (such as a silicon precursor and a reactive species) into the reaction chamber, wherein there may be a time period of overlap between the two or more precursors in the reaction chamber resulting in both an ALD component of the deposition and a CVD component of the deposition. This is referred to as a hybrid process. In accordance with further examples, a cyclic deposition process may comprise the continuous flow of one reducing agent or precursor and the periodic pulsing of the other chemical component into the reaction chamber. The temperature and/or pressure within a reaction chamber during step 104 can be the same or similar to any of the pressures and temperatures noted above in connection with step 102.

Figure 2:
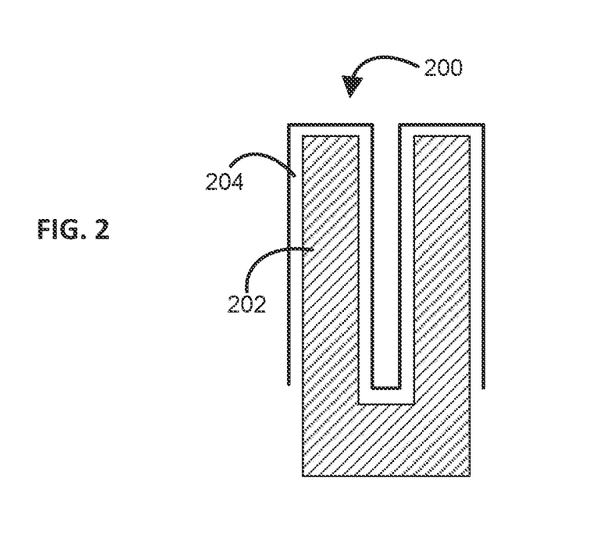
FIG. 2 depicts an exemplary structure comprising a SiN layer according to the current disclosure.

FIG. 2 depicts an exemplary structure comprising a SiN layer according to the current disclosure in a schematic manner. Portion of a device or structure 200 includes a substrate 202 and a SiN layer 204. Substrate 202 can be or include any of the substrate material described herein, such as a dielectric or insulating layer. SiN layer 204 can be formed according to a method described herein.

In some embodiments, a SiN layer may be deposited directly on the substrate as depicted in FIG. 2. Alternatively, a SiN layer may be deposited on a previously deposited layer. The structure or a device according to the current disclosure may comprise more than one layer between substrate and SiN layer. Further, in some embodiments, a SiN layer is deposited on the substrate, and at least one additional layer is deposited on the SiN layer. In some embodiments, the SiN layer 204 can consist essentially of, or consist of SiN. Structures and devices in accordance with examples of the disclosure can include horizontal structures, vertical and/or three-dimensional structures and devices.

Figure 3:
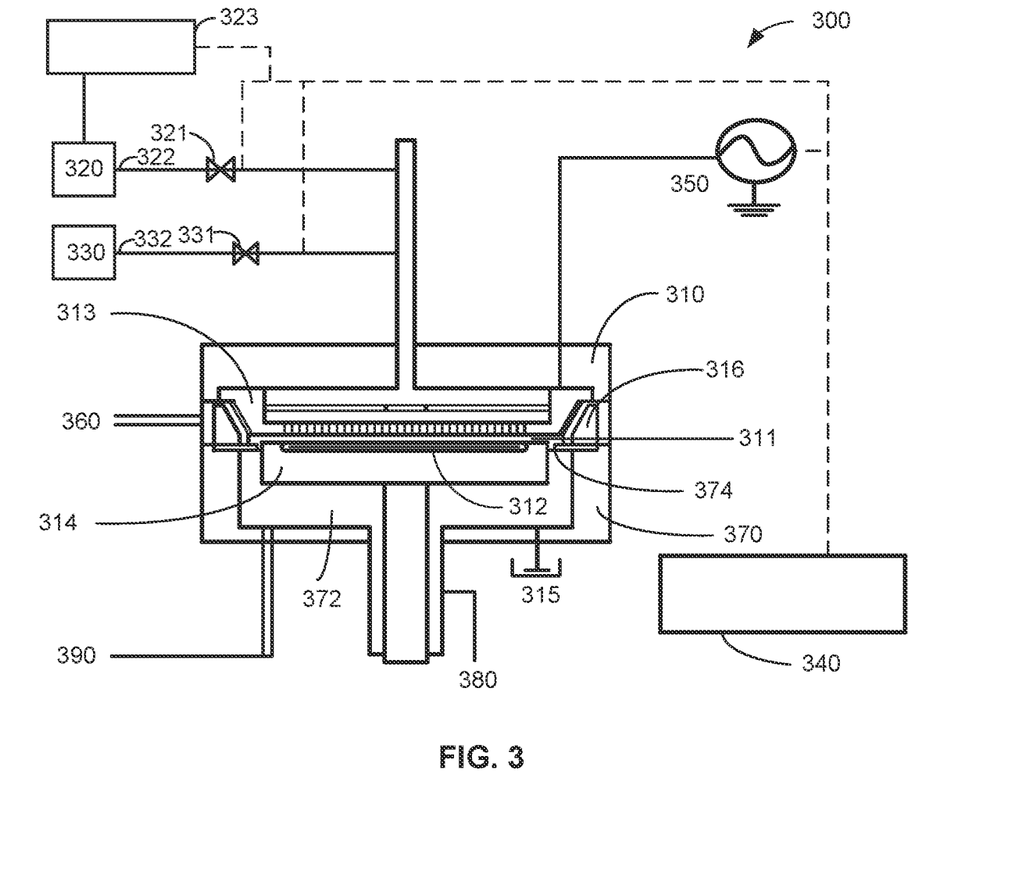
FIG. 3 presents a deposition assembly according to the current disclosure in a schematic manner.

FIG. 3 illustrates a vapor deposition assembly 300 in accordance with exemplary embodiments of the current disclosure. Vapor deposition assembly 300 includes one or more reaction chambers 310 for accommodating a substrate 312. The assembly comprises a silicon precursor source 320 for a silicon precursor in gas communication via a first valve 321 with a reaction chamber 310, a nitrogen precursor source 330 for a nitrogen precursor in gas communication via a second valve 331 with a reaction chamber 310. The assembly further comprises a controller 340 operably connected to the first and second valves 321 and 331. The controller 340 is configured and programmed to control supplying a silicon precursor in the reaction chamber 310, supplying nitrogen-containing plasma into the reaction chamber 310 to form a reactive species for depositing silicon nitride on the substrate 312. The deposition assembly 300 according further comprises a temperature regulation system 323 for regulating a temperature of the silicon precursor source 320.

Controller 340 includes electronic circuitry and software to selectively operate valves, manifolds, heaters, pumps and other components included in the deposition assembly 300. Such circuitry and components operate to introduce precursors and other gases from the respective sources. Controller 340 can control timing of gas pulse sequences, temperature of the substrate and/or reaction chamber 310, pressure within the reaction chamber 310, and various other operations to provide proper operation of the deposition assembly 300. The controller 340 is configured such that the supply times for the silicon precursor and nitrogen precursor may be independently selected. Controller 340 can include control software to electrically or pneumatically control valves to control flow of precursors, reducing agents and purge gases into and out of the reaction chamber 310. An assembly can include one or more controller(s), such as controller 340, programmed or otherwise configured to cause the deposition processes described herein to be conducted. The controller(s) 340 can be connected with the various power sources, temperature regulation and heating systems, pumps, robotics, and gas flow controllers or valves of the assembly.

Although not illustrated, vapor deposition assembly 300 can include additional sources and additional components typically found on vapor deposition assembly. Optionally, vapor deposition assembly 300 is provided with a heater to activate the reactions by elevating the temperature of one or more of the substrate, silicon precursor, nitrogen precursor, purging gas, inert gas and additional carrier gas(es).

Vapor deposition assembly 300 may be provided with a RF power source 350 operably connected with the controller 340 constructed and arranged to produce a plasma of the nitrogen precursor. The process with a plasma may be performed using vapor deposition assembly 300, desirably in conjunction with controls programmed to conduct the sequences described herein, usable in at least some embodiments of the present disclosure. In the assembly illustrated in FIG. 3, by providing a pair of electrically conductive flat-plate electrodes 313, 314 in parallel and facing each other in the interior 311 (reaction zone) of reaction chamber 310, applying RF power (e.g., 13.56 MHz or 27 MHz) from a power source 350 to one side, and electrically grounding the other side 315, a plasma is excited between the electrodes 313, 314.

A temperature regulator can be provided in a lower stage 314 (the lower electrode), and a temperature of substrate 312 placed thereon can be kept at a relatively constant temperature. The upper electrode 313 can serve as a shower plate as well, and precursor gases and optionally an inert gas(es) and/or purging gases can be introduced into the reaction chamber 310 through gas lines 321, 331, respectively, and through the shower plate 313.

Additionally, in the reaction chamber 310, a circular duct 316 with an exhaust line 360 is provided, through which gas in the interior 311 of the reaction chamber 310 is exhausted. Additionally, a transfer chamber 370—e.g., disposed below the reaction chamber 310—is provided with a seal gas line 380 to introduce seal gas into the interior 311 of the reaction chamber 310 via the interior 372 (transfer zone) of the transfer chamber 370, wherein a separation plate 374 for separating the reaction zone and the transfer zone is provided (a gate valve through which a wafer is transferred into or from the transfer chamber 370 is omitted from this figure). The transfer chamber 370 is also provided with an exhaust line 390. In some embodiments, all deposition and/or optional surface treatment processes are performed in the same reaction chamber, so that all the steps can continuously be conducted without exposing the substrate 312 to air or other oxygen-containing atmosphere. In some embodiments, a remote plasma unit can be used for exciting a nitrogen-containing gas.

A nitrogen-containing plasma may be generated in situ, for example, in a gas that flows continuously throughout the deposition chamber. In other embodiments, the plasma may be generated remotely and provided to the reaction chamber.

In some embodiments, a dual chamber reactor (two sections or compartments for processing wafers disposed closely to each other) can be used, wherein a process gas and an inert gas can be supplied through a shared line, whereas each precursor gas can be supplied through unshared lines.

Further, as a schematic representation of an deposition assembly, many components have been omitted for simplicity of illustration, and such components may include, for example, various valves, manifolds, purifiers, heaters, containers, vents, and/or bypasses.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

What is claimed is:

1. A method of depositing a silicon nitride layer on a substrate by a plasma-enhanced cyclic deposition process, the method comprising:
    regulating, outside a reaction chamber, a temperature of a silicon precursor to be between 15° C. and 45° C., wherein the silicon precursor comprises a liquefied SiH$_3$X gas and wherein X is iodine or bromine;
    providing a substrate in the reaction chamber; and
    depositing the silicon nitride layer on the substrate by a plurality of deposition cycles, each cycle comprising:
        providing, by evaporation of the temperature-regulated silicon precursor, a vapor-phase silicon precursor into the reaction chamber;
        removing excess vapor-phase silicon precursor and possible reaction byproducts from the reaction chamber; and
        providing a reactive species generated from a nitrogen-containing plasma into the reaction chamber to form silicon nitride on the substrate.

2. The method of claim 1, wherein the reactive species comprises at least one of N*, NH*, or NH$_2$* radicals.

3. The method of claim 1, wherein the reactive species are generated directly above the substrate.

4. The method of claim 1, wherein a remote plasma generator is used for generating the reactive species.

5. The method of claim 1, wherein the nitrogen-containing plasma is generated from a nitrogen-containing gas comprising one or more of the following: $NH_3$, $N_2H_4$, $N_2/H_2$ mixture, or $N_2$.

6. The method of claim 1, wherein the nitrogen-containing plasma is generated from a nitrogen-containing gas consisting of $N_2$ and $H_2$.

7. The method of claim 1, wherein the nitrogen-containing plasma is generated from a nitrogen-containing gas comprising $N_2$ and $H_2$ provided at a ($N_2/H_2$) flow ratio of 20:1 or higher.

8. The method of claim 1, wherein the nitrogen-containing plasma comprises less than 5% hydrogen gas ($H_2$) by volume.

9. The method of claim 1, wherein molecular hydrogen ($H_2$) is not provided into the reaction chamber when the reactive species are generated.

10. The method of claim 1, wherein the silicon precursor comprises $SiH_3Br$.

11. The method of claim 1, wherein the silicon precursor comprises $SiH_3I$.

12. The method of claim 1, wherein the silicon nitride layer is deposited on a three-dimensional structure.

13. The method of claim 12, wherein the three-dimensional structure comprises a sidewall and top regions, and wherein a sidewall wet etch rate (WER) of the silicon nitride layer relative to a top region WER is less than about 2 in 0.5% dilute hydrofluoric acid (dHF).

14. The method of claim 1, wherein an etch rate of the silicon nitride layer is less than about 3 nm/min in 0.5% aqueous HF.

15. The method of claim 1, wherein as deposited stress of the silicon nitride layer is between +800 MPa and −800 MPa.

16. The method of claim 1, wherein depositing the silicon nitride layer on the substrate further comprises maintaining a temperature inside the reaction chamber to be between 25° C. and 700° C.

17. A method of forming a semiconductor device, wherein the method comprises depositing silicon nitride by a plasma-enhanced cyclic deposition process, the method comprising:

regulating, outside a reaction chamber, a temperature of a silicon precursor to be between 15° C. and 45° C., wherein the silicon precursor comprises a liquefied $SiH_3X$ gas and wherein X is iodine or bromine;

providing a substrate in the reaction chamber; and conducting a plurality of deposition cycles, each cycle comprising:

providing, by evaporation of the temperature-regulated silicon precursor, a vapor-phase silicon precursor into the reaction chamber;

removing excess vapor-phase silicon precursor and possible reaction byproducts from the reaction chamber; and providing a reactive species generated from a nitrogen-containing plasma into the reaction chamber to form the silicon nitride on the substrate.

* * * * *